United States Patent
Kiser

Patent Number: 5,675,478
Date of Patent: Oct. 7, 1997

[54] OSCILLATOR VOLTAGE REGULATOR

[75] Inventor: Joseph H. Kiser, Aurora, Colo.

[73] Assignee: Vari-L Company, Inc., Denver, Colo.

[21] Appl. No.: 680,037

[22] Filed: Jul. 15, 1996

[51] Int. Cl.⁶ .............................................. H02M 3/335
[52] U.S. Cl. ................................. 363/19; 331/117 R
[58] Field of Search ....................... 363/18–19, 20–21; 323/313; 331/117 R

[56] References Cited

U.S. PATENT DOCUMENTS

| | | | |
|---|---|---|---|
| 3,813,615 | 5/1974 | Okazaki | 331/109 |
| 4,009,454 | 2/1977 | Darrow | 331/117 R |
| 4,621,241 | 11/1986 | Kiser | 331/117 R |
| 5,001,373 | 3/1991 | Bator et al. | 307/542 |

*Primary Examiner*—Peter S. Wong
*Assistant Examiner*—Rajnikant B. Patel
*Attorney, Agent, or Firm*—Ancel W. Lewis, Jr.

[57] ABSTRACT

An oscillator voltage regulator includes a substantially constant voltage device in series with the bias network dividing resistors to reduce current flow and provide a substantially constant voltage drop, and an impedance connected between the first and second resistors of the dividing resistors and the tank circuit and the base of the amplifier transistor so as to reduce the loading on the tank circuit and so as to improve stability, reduce phase noise, and increase power output from the amplifier. The use of a silicon PN junction and a NPN transistor provides temperature compensation for hot and cold ambients to allow the oscillator to operate with substantially a constant supply current.

8 Claims, 1 Drawing Sheet

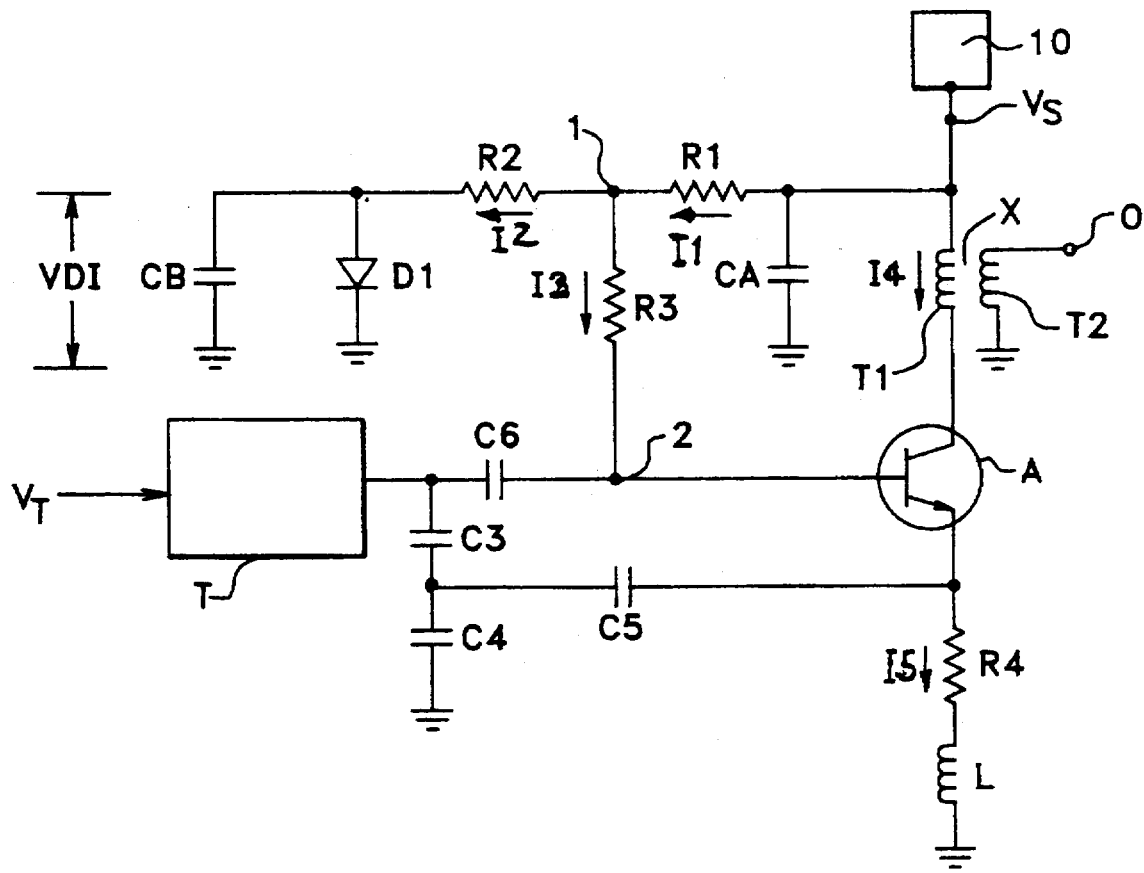

15

OSCILLATOR VOLTAGE REGULATOR

TECHNICAL FIELD

This invention relates to a voltage regulator that is particularly suitable for use with a relatively small DC battery voltage to provide a power supply for an oscillator and has particular application to cellular or portable wireless, i.e. pager, applications where the battery drain is critical.

BACKGROUND ART

An oscillator voltage regulator heretofore provided for cellular or portable wireless applications used larger DC batteries such as 3–9 volts. The oscillator had a tank circuit connected to an amplifier typically an NPN transistor having a base emitter and collector with a choke and load resistor connected between the emitter and ground. Two bias network voltage dividing resistors were connected between the bias supply voltage terminal and ground. There was a direct connection between the junction between the voltage dividing resistors and the base of the transistor and to the tank circuit.

There are two problems when the bias supply voltages are reduced from higher voltages to 1.5 volts in the above described prior art voltage regulator. 1) a large bias current results in power waste in the bias resistors and 2) due to the voltage and currents involved the impedance to ground at the junction between the dividing resistors is very low and hence loads the RF voltages from the tuned circuit, i.e. lowers the Q which results in power loss and degraded phase noise.

Kiser U.S. Pat. No. 4,621,241 discloses an electronic oscillator of the type for which the present voltage regulator may be applied and this disclosure is incorporated herein by reference.

Darrow U.S. Pat. No. 4,009,454 discloses a circuit for providing a constant amplitude signal generator for supply of DC to an oscillator.

Bator et al. U.S. Pat. No. 5,001,373 discloses the use of a zener diode in a control circuit to prevent generation of excessive noise.

DISCLOSURE OF THE INVENTION

A voltage regulator is disclosed for supplying an oscillator which is particularly suitable for operating an oscillator with an unregulated 1–1.5 V DC battery or a voltage supply. The voltage regulator circuit of the present invention adds a substantially constant voltage device in the form of a PN junction silicon diode in series with the bias network voltage dividing resistors. The voltage across the silicon diode is relatively constant (0.4–0.7 volts) at very low current and fairly independent of the bias supply voltage and therefore functions as a fairly stable reference to help establish the base bias voltage along with the voltage divider resistors to the supply voltage. Since the voltage across the diode and the voltage across the base of the transistor both shift in unison (both silicon PN junctions) with temperature, substantial compensation is accomplished to maintain the collector current more constant with temperature. An impedance, preferably a resistor, is connected between the junction of the voltage dividing resistors and the base of the transistor and the tank circuit. This impedance raises the bias network impedance to reduce loading on the tuned circuit. Typically stable bias practice does not allow a resistance in this position due to the thermal runaway and voltage drop considerations. However since the bias current in a really low power oscillator is very small the oscillator is not adversely affected by the conventional considerations and this added impedance performs greatly to improve stability, reduce phase noise and improve output power while allowing substantial temperature compensation to be accomplished as above discussed.

BRIEF DESCRIPTION OF THE DRAWINGS

Details of this invention are described in connection with the accompanying drawings which like parts bear similar reference numerals in which:

The drawing is an electric circuit diagram of an oscillator voltage regulator embodying features of the present invention.

DETAILED DESCRIPTION

Referring now to the drawing there is shown a voltage regulator for an oscillator including a tuned resonant tank circuit T connected to a signal amplifier A and an output terminal O. A voltage supply voltage 10 has a voltage supply terminal VS connected via the primary winding T1 of a coupling transformer X to the collector of the amplifier A. The transformer shown has a secondary winding T2 connected to output terminal 0.

The tank circuit T can be a series or parallel tuned tank circuit and is shown as having a DC voltage tuning input terminal VT since the oscillator can be a fixed oscillator or a voltage controlled oscillator.

The oscillator has capacitors C3 and C4 connected in series with one another between circuit T and ground, a capacitor C6 connected between terminal 2 and circuit T and a reactance in the form of a capacitor C5 connected between the emitter and between capacitors C3 and C4. The function of these capacitors is described in my above mentioned U.S. Pat. No. 4,621,241. Briefly, in the operation of the oscillator the amplifier overcomes losses to sustain the oscillations in the tank circuit. The amplifier has an input and output and the amplifier amplifies a signal in a power output path and provides a feedback signal from its output which feedback signal is fed back to the input via a part of the tank circuit. Capacitor C5 maintains the phase shift of the feedback signal between the input 2 and feedback output 3 of the amplifier at substantially zero degrees. Another suitable oscillator would be the standard Colpitts oscillator that does not have impedance C5 but rather a direct connection in place of C5.

A choke L is shown connected in series with a DC stabilization resistor R4 and this series circuit functions as well as a feedback phase shift impedance. This choke L increases efficiency but could be eliminated to reduce cost.

A first series circuit is connected between the supply voltage terminal VS and ground which includes a first bias or voltage dividing resistor R1, a second bias or voltage dividing resistor R2, and a substantially constant voltage device in the form of a silicon diode D1 having a selected resistance which reduces the current flow in the first series circuit while providing a substantially constant voltage across the device. A device suitable for diode D1 is a conventional non-linear computer switching diode that has a substantially constant terminal voltage independent of current. A bypass capacitor CA is shown connected between terminal VS and ground and a bypass capacitor CB is shown connected across diode D1. These capacitors are optional.

An impedance, preferably a resistor, R3 is connected between a junction designated 1 between the first and second voltage dividing resistors and a junction designated 2 between the tank circuit T and the base of the amplifier A to increase the RF impedance between ground and the amplifier base. Current I1 is drawn through the first voltage dividing resistor R1 and branches to provide I2 which flows through R2 and D1 to provide for a constant voltage across D1 terminals relatively independent of supply voltage VS and provide I3 which flows through the impedance R3 to provide the base bias current of the transistor. The transistor main or collector current I4 flows in response to applied base current I2 to provide desired amplifier/oscillator action given by the equation:

$$I5=I3+G(I3)=I3+I4$$

Usually circuit constants are calculated to provide for so called class A or class AB amplifier transistor operating conditions by adding resistor R3 as described transistor DC current gain G where G is the DC transistor gain typically 50 to 150. By adding resistor R3 as described there is less RF current flow in and less RF power dissipated in the resistors R2 and R1 and this power is directed to the base of the transistor of amplifier A. In essence the added impedance R3 raises the RF impedance to ground at junction 2 and directs the RF power to not be lost or dissipated in the bias network of resistors R3, R2 and R1 but rather applied to the base of the transistor. This reduced loading on the tank circuit, improves stability and reduces phase noise as well as increases the power output from the amplifier transistor.

The silicon diode D1 is a PN junction and the silicon transistor is a NPN junction. The voltage across the base of the transistor and the voltage across the diode D1 shift in unison with temperature to provide temperature compensation for hot and cold ambients and allow the oscillator to operate with a substantially constant collector current I4.

Essentially, as temperature changes the DC voltage across D1 and the transistor base change at approximately −1.6 millivolts DC per degree centigrade. To maintain the desired constant collector current I4 the DC voltage applied to the transistor base at 2 must also change at the −1.6 millivolts per degree centigrade rate. The DC voltage at 2 is derived as: V2=VD1+I2R2−I3R3 where VD1 changes with temperature at −1.6 millivolts per degree centigrade. At small values of R2 and very small values of I3, V2≅VD1, and diode changes with temperature accomplish substantial regulation/compensation to the transistor.

The above described circuit also provides regulation with changes in supply voltage. From the relationship V2≅VD we observe that since the supply voltage does not appear in this expression that V2 is relatively independent of VS and therefore the base bias voltage becomes largely independent of the supply voltage and VB is substantially regulated with changes in supply voltage resulting in a substantially more constant supply current.

In summary, the circuit of the present invention provides a) a bias voltage to the oscillator with low supply voltages (1–1.5 V DC battery), b) temperature compensation for hot and cold ambients, c) both of the above while improving noise and power performance, and d) reduces the bias current required by the voltage dividing resistors.

By way of illustration but not limitation the values of circuit components found suitable for the above circuit are:

| | |
|---|---|
| VS | 1–1.5V DC |
| VD1 | 0.7V DC |
| R1 | 2.2K ohm |
| R2 | 2.7K ohm |
| R3 | 1.5K ohm |

It is understood the present invention is applicable to other oscillators including but not limited to the Hartley oscillator.

Although the present invention has been described with a certain degree of particularity, it is understood that the present disclosure has been made by way of example and that changes in details of structure may be made without departing from the spirit thereof.

What is claimed is:

1. A voltage regulator for an oscillator including a tuned tank circuit connected to a signal amplifier having an output terminal comprising:

a supply voltage terminal connected to said amplifier, a first series circuit connected between said voltage terminal and ground including a first voltage dividing resistor, a second voltage dividing resistor and a relatively constant voltage device having a selected resistance to reduce the current flow in said first series circuit and provide a substantially constant voltage across said device, an impedance connected between a junction between said first and second resistors and a junction between said tank circuit and said amplifier to increase the impedance between said voltage terminal and said amplifier and to reduce loading on the tank circuit to improve stability, reduce phase noise and improve output power from said amplifier, whereby a bias current is drawn through said first resistor and said impedance and a main current from said terminal to said amplifier enables a relatively constant reference voltage across the device to provide for the bias voltage applied to said amplifier which allows said oscillator to operate with substantially constant current with temperature changes and to provide substantially constant supply current to the amplifier for a range of supply voltages.

2. A voltage regulator as set forth in claim 1 wherein an unregulated about 1–1.5 V DC battery is connected to said terminal.

3. A voltage regulator as set forth in claim 2 wherein the voltage drop across said device is about 0.7 V DC.

4. A voltage regulator as set forth in claim 2 wherein the value of said first resistor is about 2.2K ohm, said second resistor about 2.7K ohm and said impedance about 1.5K ohm.

5. A voltage regulator as set forth in claim 1 wherein said device is a silicon diode.

6. A voltage regulator as set forth in claim 1 wherein said signal amplifier is an NPN silicon transistor having a base, emitter and collector, and said device is a silicon PN junction, said transistor and diode both changing in unison to provide temperature compensation for hot and cold ambients.

7. A voltage regulator for an oscillator including a tuned resonant tank circuit connected to an NPN silicon transistor having a base, emitter and collector with a stabilizer resistor and inductor connected between said emitter and ground and having an output terminal, said regulator comprising:

a supply voltage terminal connected to said collector, a first series circuit connected between said voltage terminal and ground including a first voltage dividing resistor, a second voltage dividing resistor and a silicon PN junction diode to reduce current flow in said first series circuit and provide a substantially constant voltage across said diode, a third resistor connected between a junction between said first and second resistors and a junction between said tank circuit and said base to increase the resistance between said voltage terminal and said base and to reduce the loading on the tank circuit to improve stability, reduce phase noise and improve output power at said output terminal, whereby a bias current is drawn through said first resistor and said third resistor and a main or collector current from said voltage terminal to said amplifier enables a small voltage across said diode with a bias voltage applied to said amplifier allows said oscillator to operate with substantially constant collector current to provide a substantially constant collector current with temperature changes for a range of supply voltages.

8. A voltage regulator as set forth in claim wherein the voltage across said diode and the voltage across the base of said transistor shift in unison with temperature to maintain the current in said collector at a substantially constant level.

* * * * *